(12) United States Patent
Yuh et al.

(10) Patent No.: US 9,223,922 B2
(45) Date of Patent: Dec. 29, 2015

(54) SEMICONDUCTOR DEVICE DESIGN METHOD

(71) Applicant: TAIWAN SEMICONDUCTOR MANUFACTURING COMPANY, LTD., Hsinchu (TW)

(72) Inventors: Ping-Hung Yuh, New Taipei (TW); Cheng-I Huang, Hsinchu (TW); Chung-Hsing Wang, Baoshan Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/658,749

(22) Filed: Mar. 16, 2015

(65) Prior Publication Data

US 2015/0186579 A1    Jul. 2, 2015

Related U.S. Application Data

(60) Continuation of application No. 14/291,285, filed on May 30, 2014, now Pat. No. 8,990,762, which is a division of application No. 13/547,251, filed on Jul. 12, 2012, now Pat. No. 8,769,451.

(51) Int. Cl.
*G06F 9/45* (2006.01)
*G06F 17/50* (2006.01)

(52) U.S. Cl.
CPC ........ *G06F 17/5045* (2013.01); *G06F 17/5081* (2013.01)

(58) Field of Classification Search
CPC .......................................................... G06F 9/45
USPC ........................................................... 716/103
See application file for complete search history.

(56) References Cited

U.S. PATENT DOCUMENTS

| | | | |
|---|---|---|---|
| 7,243,317 B2 | 7/2007 | Wang et al. | |
| 7,937,678 B2 | 5/2011 | Lippmann et al. | |
| 2006/0190876 A1* | 8/2006 | Yamada | 716/5 |

* cited by examiner

*Primary Examiner* — Thuan Do
(74) *Attorney, Agent, or Firm* — Hauptman Ham, LLP

(57) ABSTRACT

A method of generating a netlist comprises extracting a first capacitance value between the first set of electrical components inside a defined region using a first extraction technique. The method additionally comprises extracting a second capacitance value between a second set of electrical components comprising at least one electrical component outside the defined region using a second extraction technique different from the first extraction technique. The method also comprises generating the netlist including the first capacitance value and the second capacitance value. The first extraction technique is capable of extracting capacitance values between electrical components arranged in a first quantity of directions with respect to one another and the second extraction technique is capable of extracting capacitance values between electrical components arranged in a second quantity of directions with respect to one another. The first quantity of directions is greater than the second quantity of directions.

20 Claims, 10 Drawing Sheets

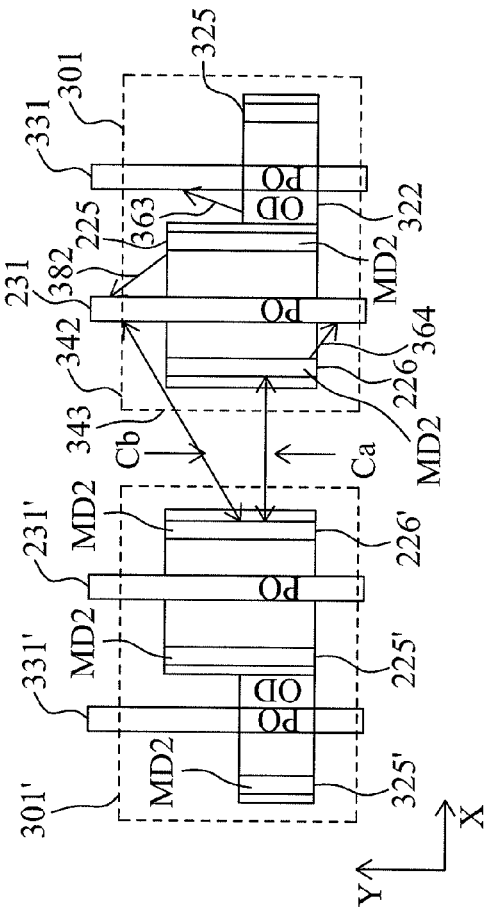
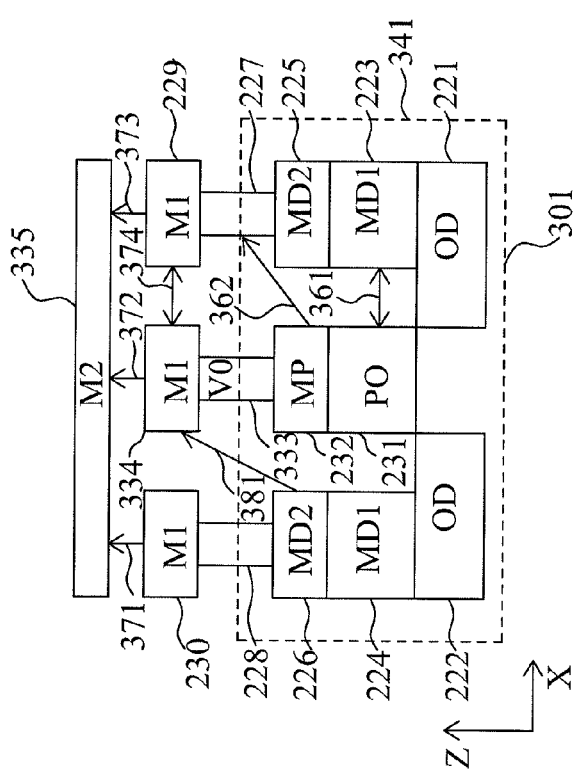
Fig. 3A
Fig. 3B

SEMICONDUCTOR DEVICE DESIGN METHOD

PRIORITY CLAIM

The present application is a continuation of U.S. application Ser. No. 14/291,285, filed May 30, 2014, now U.S. Pat. No. 8,990,762, which is a divisional of U.S. application Ser. No. 13/547,251, filed Jul. 12, 2012, now U.S. Pat. No. 8,769,451, which are incorporated by reference herein in their entireties.

BACKGROUND

The recent trend in miniaturizing integrated circuits (ICs) has resulted in smaller devices which consume less power, yet provide more functionality at higher speeds than before. The miniaturization process has also resulted in stricter design and manufacturing specifications. Pre-manufacture checking and testing are performed to make sure that a semiconductor device can be made and will function as designed.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 3A-3C are schematic side or top views of a region of a semiconductor device, for explaining parasitic parameter extraction processes in accordance with some embodiments.

DETAILED DESCRIPTION

Figure 1:
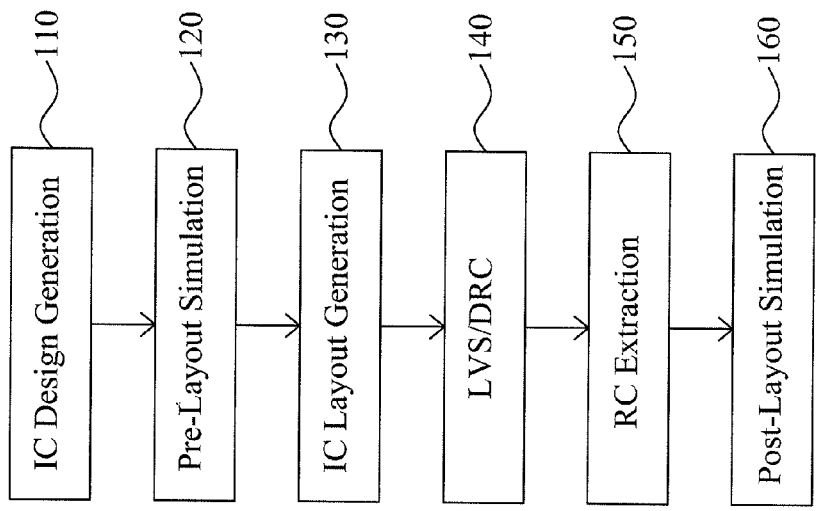
FIG. 1 is a functional flow chart of at least a portion of a semiconductor device design flow in accordance with some embodiments.

It is to be understood that the following disclosure provides many different embodiments or examples, for implementing different features of various embodiments. Specific examples of components and arrangements are described below to simplify the present disclosure. An inventive concept may, however, be embodied in many different forms and should not be construed as being limited to the embodiments set forth herein; rather, these embodiments are provided so that this description will be thorough and complete, and will fully convey an inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of an inventive concept.

Some embodiments describe a semiconductor device design method and system in which parasitic parameters inside and outside a region of a layout of a semiconductor device are extracted by different tools and/or methodologies. For example, a parasitic parameter extraction tool/methodology with higher accuracy and higher demand for computing resources is used for extracting parasitic parameters inside the region, whereas another parasitic parameter extraction tool/methodology with lower accuracy and lower demand for computing resources is used for extracting parasitic parameters outside the region. As a result, it is possible to combine accuracy and efficiency of various parasitic parameter extraction tools and/or methodologies while achieving a fast and accurate parasitic parameters extraction result. In some embodiments, a first RC extraction tool or methodology is considered more accurate than a second RC extraction tool or methodology when the first RC extraction tool or methodology is configured to extract more types of parasitic parameters between electrical components than the second RC extraction tool or methodology. Additionally or alternatively, a first RC extraction tool or methodology is considered more accurate than a second RC extraction tool or methodology if the first RC extraction tool or methodology extracts a parasitic parameter while taking into consideration more electrical components than the second RC extraction tool or methodology when the second RC extraction tool or methodology is used to extract the same parasitic parameter.

FIG. 1 is a functional flow chart of at least a portion of a semiconductor device design flow 100 in accordance with some embodiments. The design flow 100 utilizes one or more electronic design automation (EDA) tools for testing a design of a semiconductor device before manufacturing the same device. The EDA tools, in some embodiments, are one or more sets of executable instructions for execution by a processor or controller, or a programmed computer to perform the indicated functionality.

At operation 110, a design of a semiconductor device is generated or provided by a circuit designer. In some embodiments, the design is generated or provided in the form of a schematic netlist, such as a Simulation Program with Integrated Circuit Emphasis (SPICE) netlist. Other data formats for describing the design are usable in some embodiments.

At operation 120, a pre-layout simulation is performed, e.g., by an EDA tool, such as HSPICE available from Synopsys, Inc. of Mountain View, Calif., on the design to determine whether the design meets a predetermined specification. If the design does not meet the predetermined specification, the semiconductor device is redesigned. In some embodiments, a SPICE simulation is performed on the SPICE netlist generated or provided at operation 110. Other simulation tools are usable, in place of or in addition to the SPICE simulation, in other embodiments.

At operation 130, a layout of the semiconductor device is generated based on the design. In some embodiments, the layout is generated in the form of a Graphic Design System (GDS) file by an EDA tool, such as VIRTUOSO available from Cadence Design Systems, Inc. of San Jose, Calif. Other tools and/or data formats for describing the layout are usable in other embodiments.

At operation 140, a layout-versus-schematic (LVS) extraction or check, is performed. The LVS check is run to ensure that the generated layout corresponds to the design. Specifically, an LVS extraction tool, i.e., an EDA tool, such as CALIBRE available from Mentor Graphics Inc. of Wilsonville, Oreg., recognizes electrical components as well as connections therebetween from the pattern of the generated layout. The LVS extraction tool then generates a layout netlist representing the recognized electrical components and connections. The layout netlist generated from the layout is compared with the schematic netlist of the design. If the two netlists match within a matching tolerance, the LVS check is passed. Otherwise, correction is made to at least one of the layout or the design by returning the process to operation 110 and/or operation 130.

In some embodiments, a design rule check (DRC) is also performed, for example, before the LVS check, to ensure that the layout satisfies certain manufacturing design rules, i.e., to ensure that the semiconductor device can be manufactured. If one or more design rules is violated, correction is made to at least one of the layout or the design by returning the process to operation 110 and/or operation 130. Other verification processes are usable in other embodiments.

At operation 150, a resistance and capacitance (RC) extraction is performed, e.g., by an EDA tool, such as HIPEX available from Silvaco, Inc. of Santa Clara, Calif. The RC extraction is run to determine parasitic parameters, e.g., parasitic resistance and parasitic capacitance, of interconnects in the semiconductor device's layout for timing simulations in a subsequent operation. Such parasitic parameters are not intended by the circuit designer, but nevertheless occur as a result of configurations and/or materials of the pattern in the layout. In some embodiments, a technology file is used by an RC extraction tool, i.e., another EDA tool, to extract parasitic parameters. The extracted parasitic parameters are added to the netlist provided by the LVS extraction tool to output a modified netlist.

At operation 160, a post-layout simulation is performed to determine, taking the extracted parasitic parameters into account, whether the layout meets a predetermined specification. Specifically, a simulation tool, i.e., another EDA tool, performs a simulation on the modified netlist outputted by the RC extraction tool. If the simulation indicates that the layout does not meet the predetermined specification, e.g., if the parasitic parameters cause undesirable delays, correction is made to at least one of the layout or the design by returning the process to operation 110 and/or operation 130. Otherwise, the layout is passed to manufacture or additional verification processes. In some embodiments, the post-layout simulation is a SPICE simulation. Other simulation tools are usable, in place of or in addition to SPICE, in some embodiments.

In one or more embodiments, one or more of the above-described operations 110-140 and 160 are omitted.

The accuracy and speed of the RC extraction are design considerations which, under certain circumstances, might be in conflict with each other. On the one hand, an accurate RC extraction results in an accurate timing simulation in a subsequent post-layout simulation which, in turn, permits an accurate evaluation of the layout for semiconductor devices to be manufactured. On the other hand, an accurate RC extraction often demands more computing resources and is therefore slower than a less accurate RC extraction. At lower process nodes, it is possible to sacrifice some degrees of accuracy to obtain a desired RC extraction speed by performing a less accurate RC extraction. However, at advanced process nodes, various devices have complex 3-dimensional (3D) structures and/or the devices are densely placed with respect to each other which raise timing concerns. To address such timing concerns, an accurate RC extraction is performed at the expense of speed. In certain cases where a full chip RC extraction is to be performed, the RC extraction speed may become undesirably slow.

Some embodiments therefore provide a compromise by performing an accurate RC extraction in areas where RC extraction accuracy is preferred, and a less accurate RC extraction in areas where RC extraction speed is preferred. As a result, it is possible to achieve a fast and accurate mixed RC extraction that is suitable for full chip RC extraction at advanced nodes.

Figure 2:
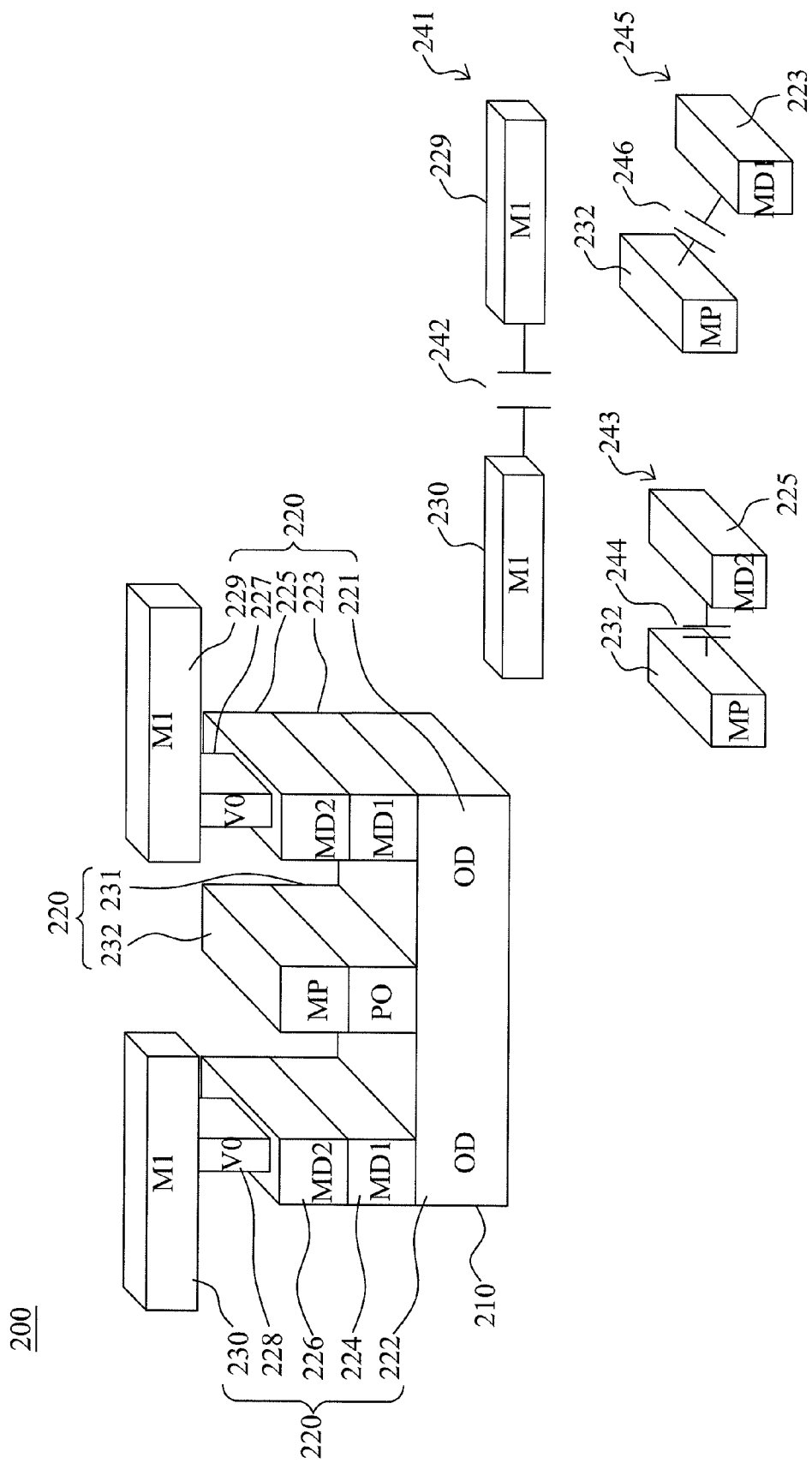
FIG. 2 includes schematic perspective views of a region of a semiconductor device and several patterns of electrical components extracted from the region, in accordance with some embodiments.

FIG. 2 includes schematic perspective views of a region of a semiconductor device 200 and several patterns of electrical components extracted from the region, in accordance with some embodiments. The semiconductor device 200 includes a semiconductor substrate 210, and a plurality of electrical components 220 formed in and/or over the semiconductor substrate 210.

The semiconductor substrate 210 includes, but is not limited to, bulk silicon, a semiconductor wafer, a silicon-on-insulator (SOI) substrate, or a silicon germanium substrate. Other semiconductor materials including group III, group IV, and group V elements are used in some embodiments.

Each of the electrical components 220 includes at least a portion or an entirety of an active element or a passive element. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drains. Examples of passive elements include, but are not limited to, capacitors, inductors, fuses, resistors, and interconnects. Examples of interconnects include, but are not limited to, vias, conductive pads, conductive traces, and conductive redistribution layers.

In the semiconductor device 200, the electrical components 220 include oxide definition (OD) regions 221, 222, wiring parts 223-226, vias 227, 228, metal parts 229, 230, polysilicon (PO) region 231, and a wiring part 232. The OD regions 221, 222 are doped regions that define source/drain regions of a transistor. The PO region 231, which is metal in one or more embodiments, defines a gate electrode of the transistor. The wiring parts 223, 225 and via 227 serially connect the OD region 221 to the metal part 229. The wiring parts 224, 226 and via 228 serially connect the OD region 222 to the metal part 230. The wiring part 232 is connected to the PO region 231 and, together with the metal parts 229, 230, electrically connects the gate, drain and source of the transistor to external circuitry or to other active or passive elements of the semiconductor device 200.

The electrical components 220 are arranged in a 3D arrangement in various layers stacked one on top another in a thickness direction (vertical direction in the drawing of FIG. 2) of the semiconductor device 200. More specifically, the wiring parts 223, 224 are formed in a layer MD1 over the OD regions 221 and 222, the wiring parts 225, 226 are formed in a layer MD2 over the layer MD1, the vias 227, 228 are formed in a via 0 (V0) layer over the layer MD2, the metal parts 229, 230 are formed in a metal 1 (M1) layer over the V0 layer, the PO region 231 is formed over the semiconductor substrate 210, and the wiring part 232 is formed in a layer MP over the PO region 231. The above-described structure is only an example configuration, and other arrangements of electrical components in the semiconductor device 200 are contemplated in various embodiments. For example, in one or more embodiments. more than one metal layers, e.g., a metal 2 (M2) layer and up, are formed over the M1 layer. The metal layers are connected with each other by via layers, e.g., a via 1 (V1) layer and up, each interposed between a pair of adjacent metal layers.

An RC extraction methodology in accordance with some embodiments includes recognizing one or more predetermined patterns (also referred to as "primitive patterns") of one or more electrical components in the semiconductor device 200, and extracting parasitic parameters from the recognized patterns. For example, a pattern 241 of metal parts 229, 230 in the M1 layer is recognized as a primitive pattern (by, e.g., referring to a database of primitive patterns), and a parasitic capacitance 242 between the metal parts 229, 230 is extracted. Likewise, a pattern 243 of the wiring part 232 in the layer MP and the wiring part 225 in the layer MD2, which are at about the same level, is recognized as a primitive pattern, and a parasitic capacitance 244 between the wiring parts 232, 225 is extracted. A pattern 245 of the wiring part 232 in the layer MP and the wiring part 223 in the layer MD1, which are at different layers/levels, is also recognized as a primitive pattern, and a parasitic capacitance 246 between the wiring parts 232, 223 is extracted.

The primitive patterns 241, 243, 245 are recognizable, in accordance with some embodiments, by a 2.5-dimensional (2.5D) RC extraction methodology. The 2.5D RC extraction methodology is more accurate than a 2-dimensional (2D) RC extraction methodology in that it permits extraction of parasitic parameters in some 3D directions, as shown in the patterns 245, 247. The 2.5D RC extraction methodology is, however, less accurate than a 3D RC extraction methodology. A benefit of using primitive patterns in a 2.5D RC extraction methodology is to reduce the extraction time compared to a 3D RC extraction methodology.

In some embodiments, a first approach for reducing the extraction time in the 2.5D RC extraction of a parasitic parameter is to use a subset of the electrical components 220. For example, for the parasitic capacitance 246, the subset used for the 2.5D RC extraction includes the pattern 245 with the wiring part 232 and the wiring part 223. In contrast, for extracting the same parasitic parameter, i.e., the parasitic capacitance 246, electrical components other than the subset of the wiring part 232 and the wiring part 223 are used in a 3D RC extraction tool or methodology. In accordance with a second approach (in lieu of or in addition to the first approach) for reducing the extraction time in a 2.5D RC extraction in accordance with some embodiments, parasitic parameters are pre-extracted (or pre-characterized) and stored into a look-up table. Thus, after a primitive pattern (e.g., the pattern 245) is recognized from the layout, the corresponding pre-extracted parasitic parameter(s) (e.g., the parasitic capacitance 246) is/are retrieved from the look up table, without performing time-consuming extraction. However, compared to a 3D RC extraction methodology in accordance with some embodiments, the described 2.5D RC extraction methodology is less accurate in one or more aspects. First, as described above, during a 2.5D RC extraction of a certain parasitic parameter, some electrical components (also referred to as polygons) are not included in the corresponding primitive pattern, and therefore, the electrical field around one or more polygons in the primitive pattern is not the same as when the whole chip or the whole semiconductor device 200 is extracted with a 3D RC extraction methodology in accordance with some embodiments.

For example, the pattern 245 does not include the wiring part 225, and therefore, the electrical field around one or more of the wiring part 232 or the wiring part 223 in the pattern 245 is not the same as when the whole chip or the whole semiconductor device 200 is extracted with a 3D RC extraction methodology. Therefore, there is a certain degree of inaccuracy of the parasitic parameter 246 extracted by a 2.5D RC extraction methodology. Second, it is not easy in practice to represent various layouts by a set of primitive patterns. In some embodiments, if a 2.5D RC extraction tool is unable to find a primitive pattern that exactly matches a subset of electrical components, the 2.5D RC extraction tool chooses the closest primitive pattern for parasitic parameter extraction which results in a certain degree of inaccuracy of the parasitic parameter being extracted.

To the contrary, a 3D RC extraction methodology uses more electrical components than a 2.5D RC extraction methodology for extracting the same parasitic parameter, and is, therefore, more accurate than the 2.5D RC extraction methodology. In some embodiments, the 3D RC extraction methodology extracts parasitic parameters for electrical components, including wiring parts and vias, in the semiconductor device 200 or in a region thereof without dividing the electrical components into a set of primitive patterns. As a result, the 3D RC extraction methodology is more accurate than the 2.5D RC extraction methodology. However, the 2.5D RC extraction methodology involves a lower computational load and is therefore faster than the 3D RC extraction methodology. The 2.5D RC extraction methodology also demands less computing resources which include, but are not limited to, processor time, memory and/or storage space, network throughput, electrical power, and other similar computing resources. Thus, the lower-level (i.e., 2.5D) RC extraction methodology is faster, less accurate, and less demanding in term of computing resource than the higher (i.e., 3D) RC extraction methodology. This applies to the chain from 3D, 2.5D, 2D, to 1D RC extraction methodologies.

Some embodiments provide a compromise in that a parasitic parameter extraction tool/methodology with higher accuracy and higher demand for computing resources is used for extracting parasitic parameters inside a region where accuracy is preferred, whereas another parasitic parameter extraction tool/methodology with lower accuracy and lower demand for computing resources is used for extracting parasitic parameters outside the region where speed and/or efficiency is/are preferred. As a result, it is possible to combine accuracy and efficiency of various parasitic parameter extraction tools and/or methodologies while achieving a fast and accurate parasitic parameters extraction result.

Figure 3C:
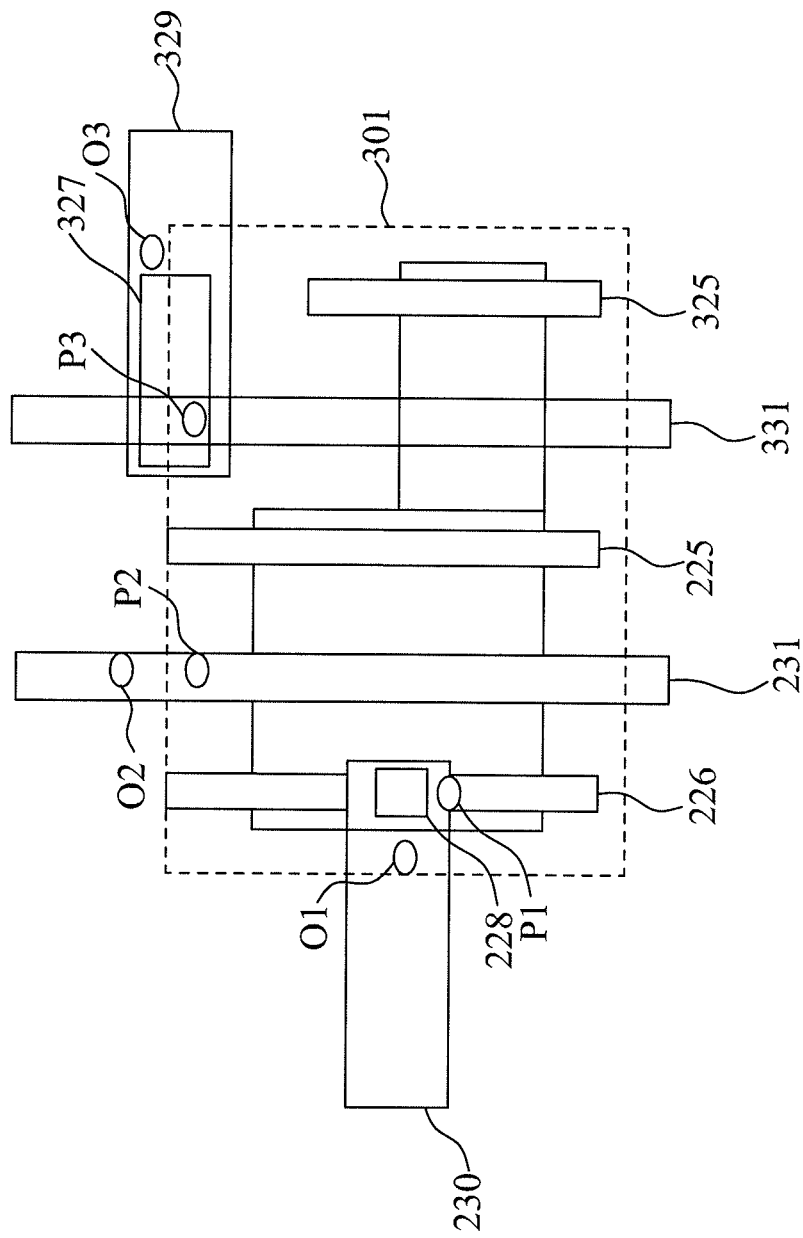

FIGS. 3A-3C are schematic side or top views of a semiconductor device 300 in the vicinity of a region 301 of the semiconductor device 300, for explaining parasitic parameter extraction processes in accordance with some embodiments. Similar to the semiconductor device 200, the semiconductor device 300 includes a plurality of electrical components such as OD regions 221, 222, wiring parts 223-226, vias 227, 228, metal parts 229, 230, PO region 231, and a wiring part 232. As shown in FIG. 3A, the semiconductor device 300 also includes a via 333 formed in the V0 layer over the wiring part 232 in the layer MD2 for connecting the PO region 231 to a metal part 334 are formed in the M1 layer. The semiconductor device 300 further includes a metal 2 (M2) layer 335 formed over the M1 layer. In some embodiments, the semiconductor device 300 also includes one or more further OD regions with corresponding one or more wiring parts, vias, metal parts, PO regions, and wiring parts formed thereover. For illustrative purposes, an OD region 322 and corresponding OD region 331 and wiring part 325 are shown in FIG. 3B. The illustrative configuration is an example, and some embodiments encompass other arrangements of electrical components in the semiconductor device 300.

In some embodiments, the region 301 is a 3D region which has a Z boundary 341 in the thickness direction (Z direction) of the semiconductor device 300, as shown in FIG. 3A. The region 301 also has boundaries in the X-Y plane, e.g., an X boundary 342 in the X direction and a Y boundary 343 in the Y direction, as shown in FIG. 3B. The boundaries 341-343 are specified by a user and/or automatically generated by a semiconductor device design system described hereinafter. In one or more embodiments, the region 301 is not necessarily box-shaped as illustrated in FIGS. 3A-3B. In one or more embodiments, an electrical component is partially inside the region 301 and partially outside the region 301, such as vias 229, 230, 333 illustrated in FIG. 3A.

In some embodiments, the user specifies the X boundary 342 and Y boundary 343 in a layout of the semiconductor device 300. The user further specifies the Z boundary 341, e.g., by identifying the number of layers in the thickness of the semiconductor device 300 that are to be included in the region 301. In one or more embodiments, the Z boundary 341 includes all layers of the semiconductor device 300. In one or more embodiments, the Z boundary 341 includes less than all layers of the semiconductor device 300, as illustrated in FIG. 3A.

In some embodiments, the semiconductor device design system automatically recognizes the region 301 from the layout of the semiconductor device 300 as a region where RC extraction accuracy is preferred over efficiency, and automatically identifies all of the boundaries 341-343 of the region 301. For example, the LVS extraction tool described with respect to FIG. 1 is configured to automatically recognize various electrical components, e.g., transistors, conductors, etc., of the semiconductor device 300. In some embodiments, transistors, especially those with complex 3D structure, are to be subject to an RC extraction methodology more accurate than that to be used for the conductors. The LVS extraction tool therefore automatically identifies the locations of those transistors. Then, another EDA tool, such as an RC extraction tool, uses the location information of the transistors to automatically generate the X boundary 342 and the Y boundary 343 based on pre-defined rules. In some embodiments, the types of electrical components that are to be subjected to an RC extraction methodology more accurate than that to be used for the other electrical components of the semiconductor device 300 are preset in the RC extraction tool.

In some embodiments, the region 301 is identified both by user-defined settings and the semiconductor device design system. For example, the user identifies the Z boundary 341, whereas the semiconductor device design system automatically identifies the X boundary 342 and Y boundary 343 of the region 301. Specifically, on the one hand, the user identifies the layers to be included in the region 301, e.g., from the substrate 210 to the V0 layer, as the Z boundary 341. The semiconductor device design system, on the other hand, automatically identifies the X boundary 342 and Y boundary 343 of the region 301, using an RC extraction tool as described above. In another example, the user specifies an area (in any one or more of the X, Y and Z directions) where RC extraction accuracy is preferred over efficiency, and the semiconductor device design system automatically identifies one or more regions 301 from the user-specified area.

Parasitic parameters inside the region 301, also referred to herein as "first parasitic parameters," are extracted using a parasitic parameter extraction tool/methodology with higher accuracy than that used for extracting parasitic parameters outside the region 301. For example, parasitic parameters inside the region 301 are extracted by a 3D RC extraction methodology, whereas parasitic parameters outside the region 301 are extracted by a 2.5D or 2D RC extraction methodology which is less accurate than the 3D RC extraction methodology used inside the region 301. In the specific embodiment illustrated in FIG. 3A, parasitic parameters inside the region 301 are extracted in various directions in the 3D space and between various electrical components, and include, but are not limited to, the parasitic capacitances 242, 244, 246, 248, 250 described with respect to FIG. 2. In some embodiments, the extracted parasitic parameters inside the region 301 include surface-to-surface capacitances, edge-to-surface capacitances (i.e., fringe capacitances), and edge-to-edge capacitances (i.e., edge capacitances). In some embodiments, the parasitic parameters inside the region 301 are extracted without fragmenting the electrical components within the region 301 into a set of predefined or primitive patterns.

For illustrative purposes, some parasitic capacitances among several electrical components inside the region 301 are indicated at 361, 362, 363, 364 in FIGS. 3A-3B. Specifically, the parasitic capacitance 361 is between the PO region 231 and the wiring part 223 in the layer MD1. The parasitic capacitance 362 is between the wiring part 232 in the layer MP and a portion of the via 227 that is inside the region 301. The parasitic capacitance 363 is between the OD region 332 and the PO region 331. The parasitic capacitance 364 is between the wiring part 226 in the layer MD2 and the PO region 231. The parasitic capacitances 361, 362, 363, 364 are extracted in the arrow directions shown in FIGS. 3A-3B.

Parasitic parameters outside the region 301, also referred to herein as "second parasitic parameters," are extracted using a parasitic parameter extraction tool/methodology with lower accuracy than that used for extracting parasitic parameters inside the region 301. For example, parasitic parameters outside the region 301 are extracted by a 1D, 2D or 2.5D RC extraction methodology, whereas parasitic parameters inside the region 301 are extracted by a higher RC extraction methodology, such as 2D, 2.5D or 3D RC extraction methodology. In some embodiments, the extracted parasitic parameters inside or outside the region 301 include surface-to-surface capacitances, edge-to-surface capacitances (i.e., fringe capacitances), and edge-to-edge capacitances (i.e., edge capacitances).

For illustrative purposes, some parasitic capacitances among several electrical components outside the region 301 are indicated at 371, 372, 373, 374 in FIG. 3A. Specifically, the parasitic capacitances 371, 372, 373 are between the metal parts 230, 334, 229 of the M1 layer and the corresponding metal parts of the overlaying M2 layer that cross over the metal parts 230, 334, 229. The parasitic capacitances 371, 372, 373 are also referred to as cross-over capacitances. The parasitic capacitance 374 is between the adjacent metal parts 334 and 229 in the same M1 layer, and is referred to as a coupling capacitance. Cross-over and coupling capacitances are extracted in a 2D RC extraction methodology in accordance with some embodiments. A 2.5D RC extraction methodology in accordance with some embodiments extracts parasitic capacitance covered by the 2D RC extraction methodology, and also a few parasitic capacitances covered by a 3D RC extraction methodology. The parasitic capacitances 371, 372, 373, 374 are extracted in the arrow directions shown in FIG. 3A.

In some embodiments, the RC extraction inside the region 301 is suitable for Mid-End-of-Line (MEOL) technology, whereas the RC extraction outside the region 301 is suitable for Back-End-of-Line (BEOL) technology.

Parasitic parameters between electrical components inside the region 301 and electrical components outside the region 301, also referred to herein as "third parasitic parameters," are also extracted in accordance with some embodiments. In one or more embodiments, third parasitic parameters are extracted using a parasitic parameter extraction tool/methodology with higher accuracy than that used for extracting second parasitic parameters outside the region 301. In one or more embodiments, third parasitic parameters are extracted using the same parasitic parameter extraction tool/methodology as that used for extracting second parasitic parameters outside the region 301. In one or more embodiments, third parasitic parameters are extracted using a parasitic parameter extraction tool/methodology with lower accuracy than that used for extracting first parasitic parameters inside the region 301. In one or more embodiments, third parasitic parameters are extracted using the same parasitic parameter extraction tool/methodology as that used for extracting first parasitic parameters inside the region 301.

For example, second parasitic parameters outside the region 301, third parasitic parameters between electrical components inside and outside the region 301, and first parasitic parameters inside the region 301 are extracted using the 2D, 2.5D and 3D RC extraction methodologies. In another example, second parasitic parameters are extracted using the 2D or 2.5D extraction methodology, whereas third and first parasitic parameters are extracted by the same RC extraction methodology, such as the 2.5D or 3D RC extraction methodology, which is higher than the RC extraction methodology used for extracting second parasitic parameters.

For illustrative purposes, some parasitic capacitances between electrical components inside the region 301 and electrical components outside the region 301 are indicated at 381 and 382 in FIGS. 3A and 3B. Specifically, the parasitic capacitance 381 is between the wiring part 226 in the layer MD2 inside the region 301 and the metal part 334 in the M1 layer outside the region 301. The parasitic capacitance 382 is between the wiring part 225 in the layer MD2 inside the region 301 and a portion of the PO region 231 outside the region 301. The parasitic capacitances 381, 382 are extracted in the arrow directions shown in FIGS. 3A-3B, i.e., outward from inside the region 301. In some embodiments, third parasitic parameters are extracted between electrical components of two regions in each of which RC extraction accuracy is preferred over efficiency. For example, a region 301' which is similar to the region 301 and in which RC extraction accuracy is preferred over efficiency is also illustrated in FIG. 3B. The region 301' includes various electrical components similar to those of the region 301. Specifically, the region 301' includes wiring parts 225', 226', 325' and PO regions 231', 331' corresponding to the wiring parts 225, 226, 325 and the PO regions 231, 331 of the region 301. A third parasitic parameter Ca is extracted between the wiring part 226 inside the region 301 and the wiring part 226' inside the region 301'. Another third parasitic parameter Cb is extracted between the wiring part 226' inside the region 301' and a part of the PO region 231 outside the region 301. A particular manner for extracting the parasitic parameters Ca, Cb in accordance with some embodiments will be described herein with respect to FIGS. 4A and 4B.

In some embodiments, the RC extractions inside and outside the region 301 are performed separately. Particularly, the RC extraction outside the region 301 is performed while treating the region 301 as a black box. More particularly, electrical components as well as their interconnects and couplings inside the region 301 are ignored by the RC extraction outside the region 301 when the region 301 is treated as a black box. The separately extracted parasitic parameters are then combined together, e.g., into a netlist representing the layout of the semiconductor device 300. To preserve hierarchical connections between electrical components and/or their couplings during RC extraction and netlist combination, a plurality of pins are inserted before RC extraction and are used for combining the extracted parasitic parameters into the netlist.

For example, as shown in FIG. 3C, to represent a connection between the wiring part 226 in the layer MD2 and the metal part 230 in the M1 layer by means of the via 228 in the V0 layer, a pair of pins O1 and P1 are inserted, wherein the pin P1 is inside the region 301 and is at the wiring part 226 and the pin O1 is outside the region 301 and is at the metal part 230. In another example, a connection between a portion of the PO region 231 inside the region 301 and another portion of the same PO region 231 outside the region 301 is represented by a pair of pins O2 and P2 inserted at the boundary of the region 301, with the pin P2 inside the region 301 and the pin O2 outside the region 301. In a further example, a connection between the PO region 331 and a metal part 329 in the M1 layer by means of a via 327 in the V0 layer is represented by a pair of pins O3 and P3, wherein the pin P3 is inside the region 301 and is at the PO region 331 and the pin O3 is outside the region 301 and is at the metal part 329. The inserted pins O1-O3, P1-P3 are used for the netlist combination in which the extracted parasitic parameters inside the region 301 are coupled to corresponding extracted parasitic parameters outside the region 301 via the connections O1-P1, O2-P2, O3-P3.

In some embodiments, one or more parasitic parameters are extracted multiple times and the extracted values of the one or more parasitic parameters are combined in the netlist combination process. An example is given in FIG. 4A which is a schematic view of a portion of the layout of the semiconductor device 200 where the parasitic capacitance Ca (FIG. 3B) is to be extracted. The parasitic capacitance Ca is between the wiring part 226 inside the region 301 and the wiring part 226' inside the region 301'. In accordance with some embodiments, a net is a set of one or more interconnected electrical components, and is considered as an internal net when the net is fully covered by a region in which RC extraction accuracy is preferred over efficiency. Specifically, the wiring part 226 is an internal net because it is inside the region 301, and the wiring part 226' is also an internal net because it is inside the region 301'. The parasitic capacitance Ca is a parasitic parameter between two internal nets of two regions 301, 301'. The parasitic capacitance Ca is extracted twice, from within the region 301' to the region 301 with an extracted capacitance value C1, and from within the region 301 to the region 301' with an extracted capacitance value C2. The extracted capacitance values C1 and C2 are combined in the netlist combination process by, e.g., calculating and accepting an average value of C1 and C2 as the extracted value of the parasitic capacitance Ca.

Parasitic capacitances between electrical components outside the regions 301 or 301' are extracted once, as illustrated in FIG. 3A, at 371. RC extraction of a parasitic parameter, either inside or outside the region 301, more than twice is encompassed in some embodiments.

Figure 4B:
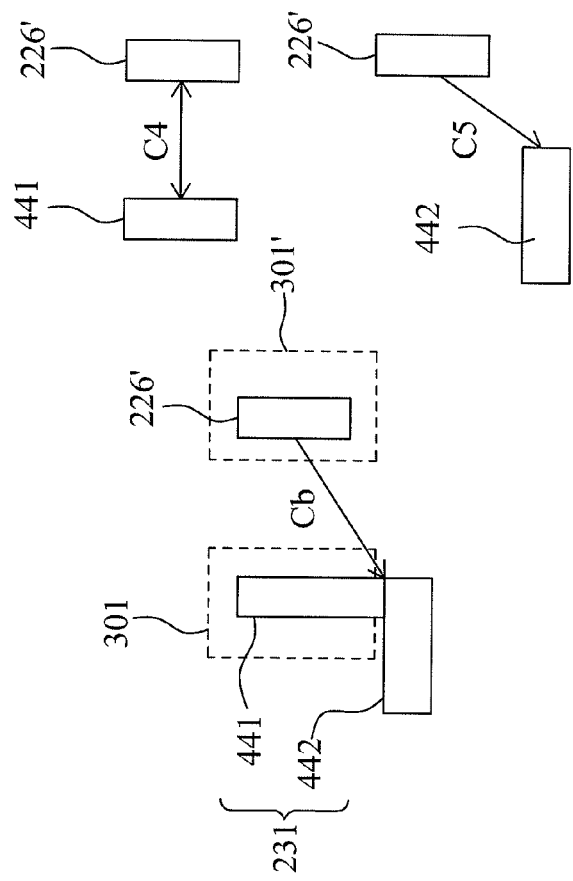
FIGS. 4A-4B are schematic views of various regions of a semiconductor device, for explaining parasitic parameter extraction processes in accordance with some embodiments.
Figure 4A:
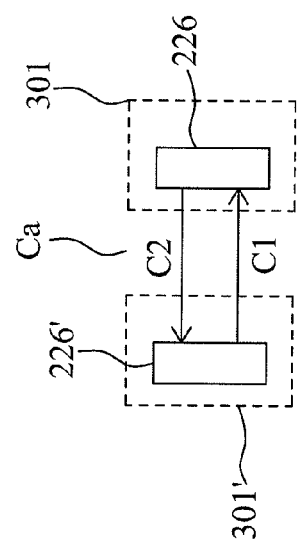

FIG. 4B is a schematic view of a portion at the boundaries of the regions 301 and 301' where the parasitic capacitance Cb (FIG. 3B) is to be extracted in accordance with some embodiments. Cb is the parasitic capacitance between the wiring part 226' in the region 301' and the PO region 231 at the boundary of the region 301. The wiring part 226' is an internal net because it is fully within the region 301'. The PO region 231 has a first portion 441 inside the region 301 and a second portion 442 outside the region 301. The PO region 231 is not an internal net because it is not fully within the corresponding region 301. In this case, Cb is decoupled, in one or more embodiments, into two parasitic capacitances, C4 and C5. C4 is the parasitic capacitance between the wiring part 226' and the first portion 441 of the PO region 231, while C5 is the parasitic capacitance between the wiring part 226' and the second portion 442 of the PO region 231. Because the first portion 441 is completely within the region 301, the first portion 441 is considered as an internal net. The parasitic capacitance C4 is extracted twice and an average value of the extracted parasitic capacitance values is used as the parasitic capacitance C4 in a manner similar to the extraction of the parasitic capacitance Ca described with respect to FIG. 4A, Because the second portion 442 is outside the regions 301, 301', the parasitic capacitance C5 is extracted once, from the wiring part 226' to the second portion 442 in a manner similar to the extraction of the parasitic capacitance 381 described with respect to FIG. 3A. Various methods, such as a simple area approximation, are usable in one or more embodiments to decouple Cb into C4 and C5. The extracted capacitance values C4 and C5 are combined using inserted pins as described with respect to FIG. 3C.

In some embodiments, by combining the accuracy of a higher RC extraction methodology (e.g., a 3D RC extraction methodology) and the efficiency of a lower RC extraction methodology (e.g., a 2D or 2.5D RC extraction methodology), a mixed, effective and accurate RC extraction methodology is obtained. Such a mixed RC extraction methodology is particularly suitable for RC extraction at advanced nodes. The mixed RC extraction methodology is further particularly suitable for devices with complex 3D structures, such as FinFETs and planar MOSs with raised source/drains. In some embodiments, however, the mixed RC extraction methodology is also suitable for other, less advanced nodes and/or devices with no or less complex 3D structures. In one or more embodiments, a desirable accuracy is preserved by extracting parasitic parameters between electrical components inside a region and electrical components outside the region using a highly accurate RC extraction methodology (e.g., a 3D RC extraction methodology). The mixed RC extraction methodology, in some embodiments, is also flexible and applicable to various semiconductor devices without being restricted by device hierarchy, cell hierarchy or specifics of tools. In one or more embodiments, the mixed RC extraction methodology is applicable to various extraction scenarios, such as FinFET RC extraction, fast device tuning extraction or interposer-based design extraction.

Figure 5A:
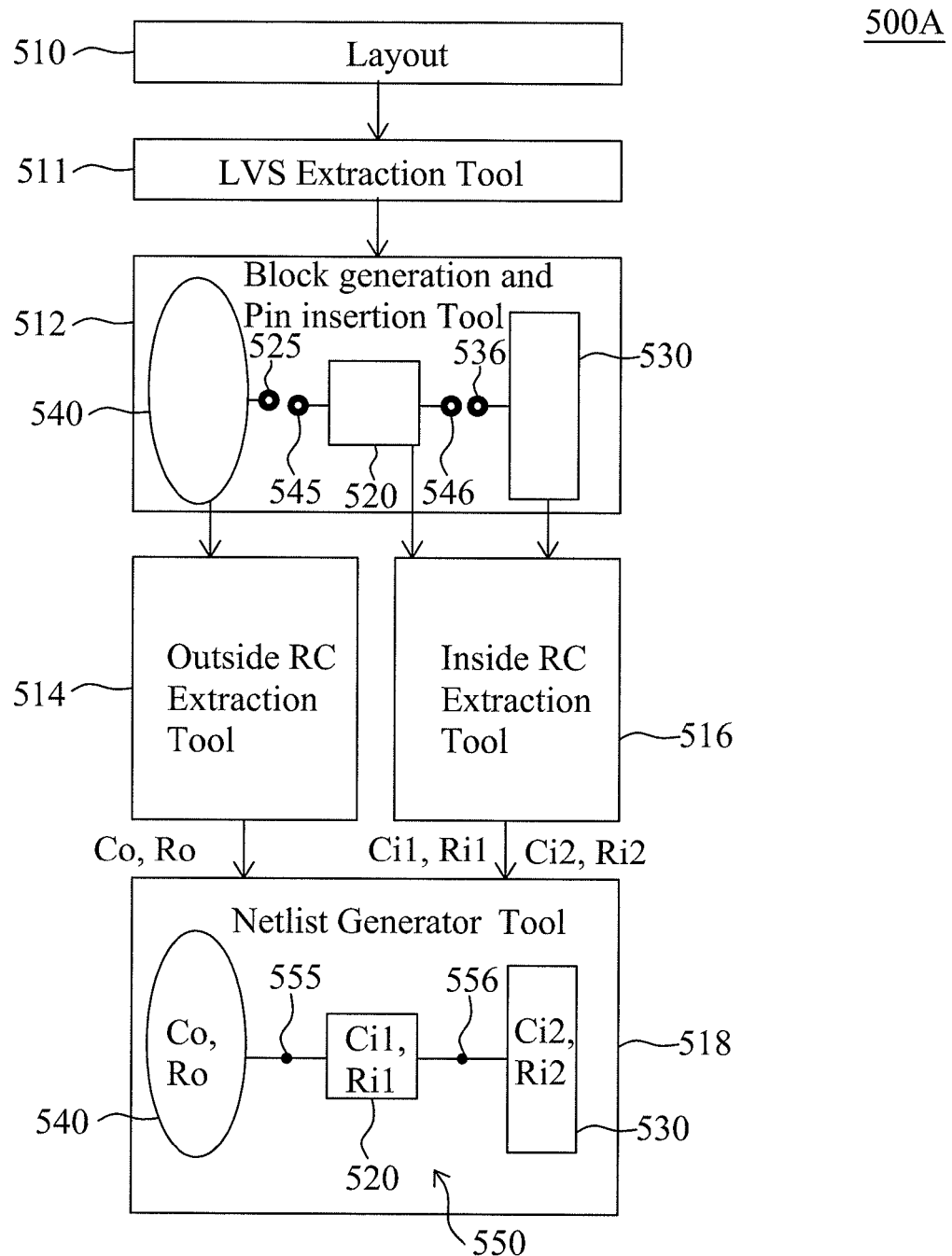
FIGS. 5A-5C are block diagrams of several semiconductor device design systems in accordance with some embodiments.

FIG. 5A is a block diagram of a semiconductor device design system 500A in accordance with some embodiments. The design system 500A is arranged to perform pre-manufacture testing and checking on a layout 510 of a semiconductor device, such as the semiconductor device 300. For this purpose, the design system 500A includes an LVS extraction tool 511, a block generation and pin insertion tool 512, an outside RC extraction tool 514, an inside RC extraction tool 516, and a netlist generator tool 518. In one or more embodiments, the LVS extraction tool 511 is omitted from the design system 500A. In one or more embodiments, more than one of the block generation and pin insertion tool 512, the outside RC extraction tool 514, the inside RC extraction tool 516 or the netlist generator tool 518 are combined in an RC extraction tool. One or more other tools, such as a layout generation tool, a DRC tool, are included in the design system 500A in accordance with some embodiments.

In one or more embodiments, the design system 500A is implemented by a computer system as described herein below with respect to FIG. 7. A processor of such a computer system is hardwired and/or programmed to function as one or more of the tools of the design system 500A.

In one or more embodiments, the design system 500A is implemented by several computer systems. A processor of each computer system is hardwired and/or programmed to function as one or more of the tools of the design system 500A. For example, the LVS extraction tool 511 is implemented by one computer system, whereas the outside RC extraction tool 514 and inside RC extraction tool 516 are implemented by another computer system. In another example, the outside RC extraction tool 514 and the inside RC extraction tool 516 are implemented by different computer systems. In one or more embodiments, data exchange between the computer systems occurs over a network that connects the computer systems. Other modes of data exchange such as emails, external hard drives are usable in some embodiments.

In one or more embodiments, a tool of the design system 500A, e.g., the inside RC extraction tool 516, is implemented by several processors and/or computer systems. Other arrangements are usable in some embodiments.

In the design system 500A, the layout 510 is inputted into the LVS extraction tool 511 which performs an LVS extraction on the layout 510 and outputs a netlist, as described with respect to FIG. 1. The netlist represents electrical components and connections therebetween as recognized by the LVS extraction tool 511. The block generation and pin insertion tool 512 uses the netlist outputted by the LVS extraction tool 511 to insert a plurality of pins to represent hierarchical connections between the recognized components and couplings, as described with respect to FIG. 3C. For example, when the layout 510 of the semiconductor device 300 is inputted into the LVS extraction tool 511, the LVS extraction tool 511 recognizes various electrical components in the semiconductor device 300, and outputs location information of the recognized electrical components. The block generation and pin insertion tool 512 uses the location information to specify one or more regions 520, 530 as regions where RC extraction accuracy is preferred over efficiency. For example, in one or more embodiments, transistors and/or active elements, especially those with complex 3D structure, are to be subject to an RC extraction methodology more accurate than that to be used for conductors and/or passive elements. Therefore, areas of transistors and/or active elements in the layout are recognized by the LVS extraction tool 511 and the block generation and pin insertion tool 512 as the regions 520, 530. The block generation and pin insertion tool 512 also specifies a region 540 which is outside the regions 520, 530 and in which RC extraction efficiency is preferred over accuracy. In some embodiments, the regions 520, 530, 540 are specified by a different tool that receives the netlist from the LVS extraction tool 511. In some embodiments, the regions 520, 530, 540 are specified automatically and/or based on user input as described with respect to FIGS. 3A-3B.

The block generation and pin insertion tool 512 further inserts a pin 525 for the region 540, a pin 536 for the region 530, and pins 545, 546 for the region 520. The pins 525 and 545 indicate a connection between the region 540 and the region 520. The pins 536 and 546 indicate a connection between the region 530 and the region 520. The regions 520, 530, 540 and the corresponding pins 525, 536, 545, 546 are included in the netlist outputted by the LVS extraction tool 511. The pins 525, 536, 545, 546 are used for a netlist combination process as described with respect to FIG. 3C.

The netlist outputted from the block generation and pin insertion tool 512 serves as input data for the outside RC extraction tool 514 and the inside RC extraction tool 516. The outside RC extraction tool 514 is configured to perform RC extraction of parasitic parameters among electrical components outside the regions 520, 530 using an RC extraction methodology with lower accuracy than that used by the inside RC extraction tool 516 for extracting parasitic parameters among electrical components inside at least one of the regions 520, 530, as described with respect to FIGS. 3A-3B. In some embodiments, the RC extraction methodology used for extracting parasitic parameters inside the region 520 is different from that used for extracting parasitic parameters inside the region 530. In some embodiments, the outside RC extraction tool 514 and inside RC extraction tool 516 are implemented by a single RC extraction tool which uses different RC extraction methodologies for extracting parasitic parameters inside the regions 520, 530 and outside the regions 520, 530. In some embodiments, more than two RC extraction tools are used to extract parasitic parameters inside and outside different regions 520, 530.

In some embodiments, parasitic parameters between electrical components inside the region 520 and electrical components outside the region 520 are also extracted by the inside RC extraction tool 516 or a different RC extraction tool, using the same or a lower RC extraction methodology used for extracting parasitic parameters inside the region 520, as described with respect to FIGS. 3A-3B. Similarly, parasitic parameters between electrical components inside the region 530 and electrical components outside the region 530 are also extracted, for example, by the same or a lower RC extraction methodology used for extracting parasitic parameters inside the region 530. In some embodiments, a parasitic parameter between an electrical component inside the region 520 and an electrical component inside the region 530 (which is considered to be outside the region 520) is extracted by the RC extraction methodology used for extracting parasitic parameters inside the region 520 and/or region 530. In one or more embodiments, the parasitic parameter between an electrical component inside the region 520 and an electrical component inside the region 530 is extracted twice, and the extracted values are combined as described with respect to FIGS. 4A-4B.

The parasitic parameters extracted from the region 520 are Ci1, Ri1, the parasitic parameters extracted from the region 530 are Ci2, Ri2, and the parasitic parameters extracted from outside the regions 520, 530 are Co, Ro. The extracted parasitic parameters are sent to/obtained by the netlist generator tool 518 to be combined into the netlist presenting the layout 510 of the semiconductor device 300. The pins 525, 545, 546, 536 are used for the netlist combination, as described with respect to FIGS. 3C, 4A and 4B. For example, the pins 525, 545 associated with the region 540 and region 520 are combined together at 555 in a combined netlist 550 to connect the regions 520, 540 with the extracted parasitic parameters Ci1, Ri1, Co, Ro. Similarly, the pins 536, 546 associated with the region 530 and region 520 are combined together at 556 in the combined netlist 550 to connect the corresponding regions 520, 530 with the extracted parasitic parameters Ci1, Ri1, Ci2, Ri2.

In some embodiments, a netlist reduction process is performed by the RC extraction tools 514, 516 and/or by the netlist generator tool 518.

The combined netlist 550 and/or portions thereof are used in the post-layout simulation to check whether the semiconductor device meets a certain specification as described with respect to FIG. 1.

Figure 5B:
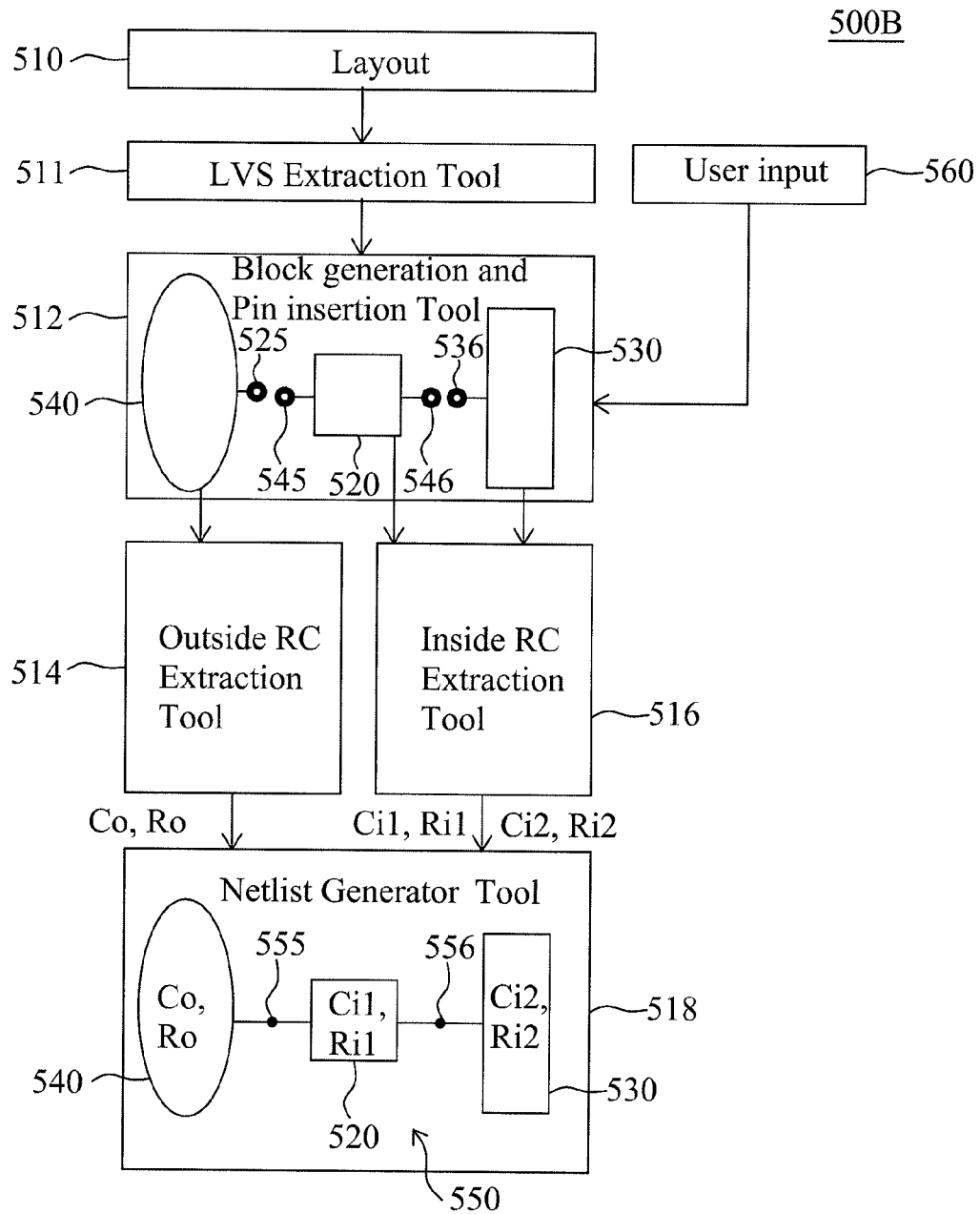

FIG. 5B is a block diagram of a semiconductor device design system 500B in accordance with some embodiments. The design system 500B is similar to the design system 500A in many aspects the description of which is omitted for simplicity. In the design system 500B, the block generation and pin insertion tool 512 is arranged to receive user input 560, e.g., via an Application Programming Interface (API). The block generation and pin insertion tool 512 specifies one or more regions 520, 530 where RC extraction accuracy is preferred over efficiency based on the user input 560 as described with respect to FIGS. 3A-3B. The remaining structure and/or operation of the design system 500B is/are similar to those of the design system 500A.

Figure 5C:
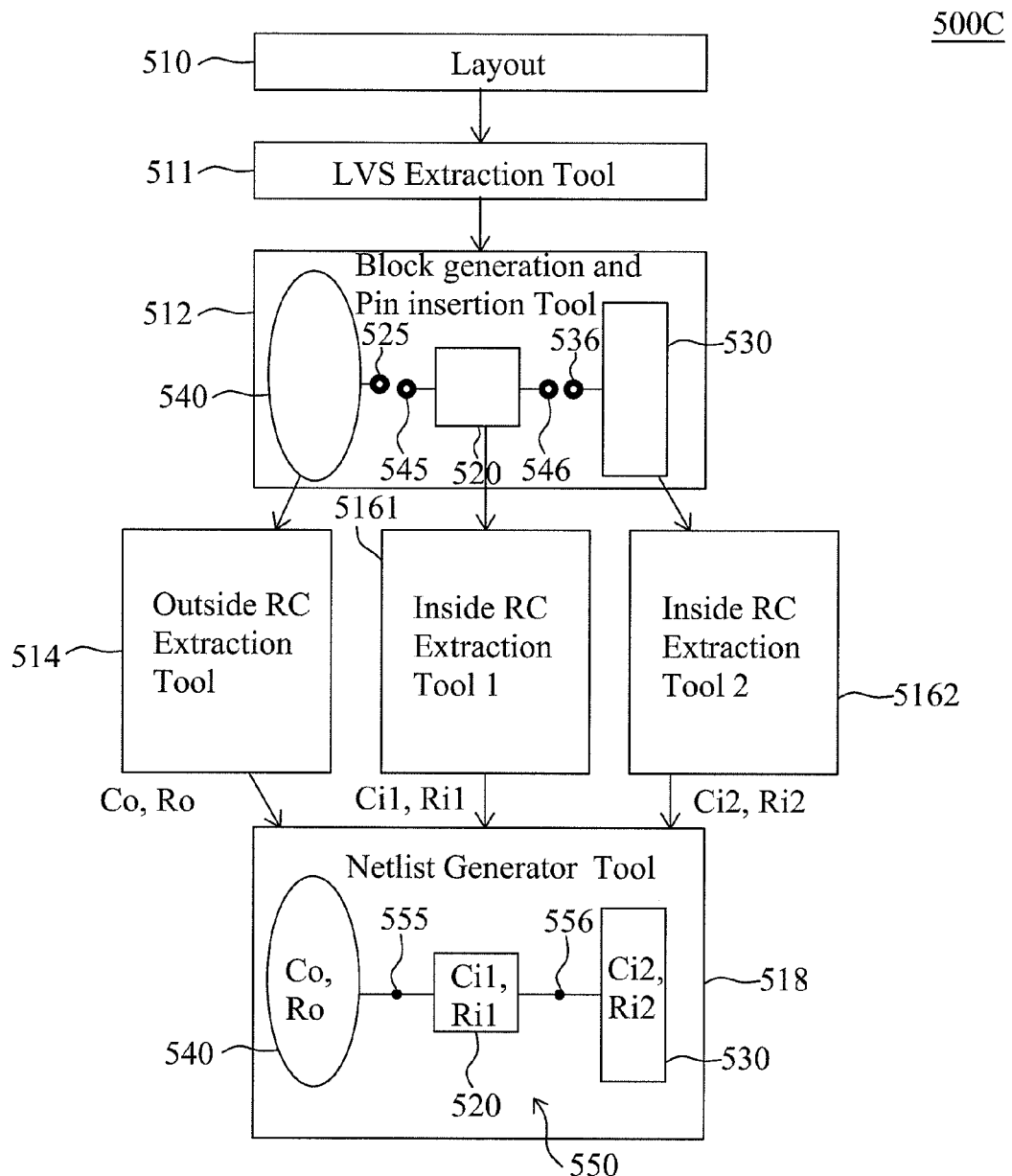

FIG. 5C is a block diagram of a semiconductor device design system 500C in accordance with some embodiments. The design system 500C is similar to the design system 500C in many aspects the description of which is omitted for simplicity. In the design system 500C, different RC extraction tools, e.g., inside RC extraction tool 5161 and inside RC extraction tool 5162, are used to extract parasitic parameters inside different regions 520, 530. The remaining structure and/or operation of the design system 500C is/are similar to those of the design system 500A.

Figure 6:
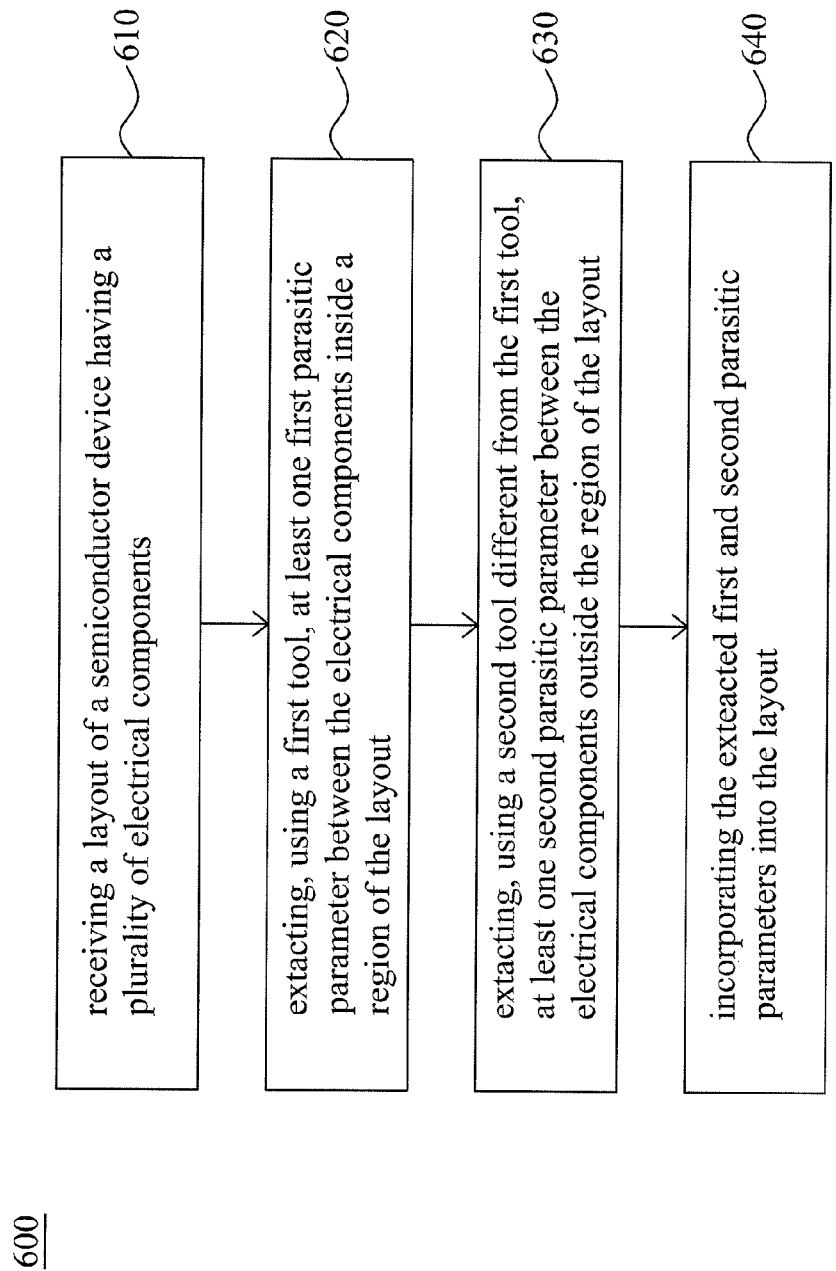
FIG. 6 is a flow chart of a semiconductor device design method in accordance with some embodiments.

FIG. 6 is a flow chart of a semiconductor device design method 600 in accordance with some embodiments. The method 600 is performed by one or more processors of one or more computer systems as described with respect to FIG. 7. The one or more processors are hardwired and/or programmed to define one or more tools described with respect to FIGS. 5A-5C.

At operation 610, a layout of a semiconductor device having a plurality of electrical components is received by a semiconductor device design system. For example, a layout 510 of a semiconductor device 300 having a plurality of electrical components 320 is received by a semiconductor device design system 500A, 500B or 500C.

At operation 620, first parasitic parameters between the electrical components inside a region of the layout are extracted using a first tool. For example, first parasitic parameters between the electrical components inside a region 310 of the layout are extracted using an inside RC extraction tool 516 that performs a highly accurate RC extraction methodology, such as a 3D RC extraction methodology.

At operation 630, second parasitic parameters between the electrical components outside the region of the layout are extracted using a second tool different from the first tool. For example, second parasitic parameters between the electrical components outside the region 310 of the layout are extracted using an outside RC extraction tool 514 that performs a less accurate (but faster) RC extraction methodology, such as a 2D or 2.5D RC extraction methodology.

At operation 640, the extracted first and second parasitic parameters are incorporated into the layout. For example, the extracted first and second parasitic parameters are incorporated, e.g., by a netlist generator tool 518, into the layout 510 to obtain a combined or modified layout 550.

Figure 7:
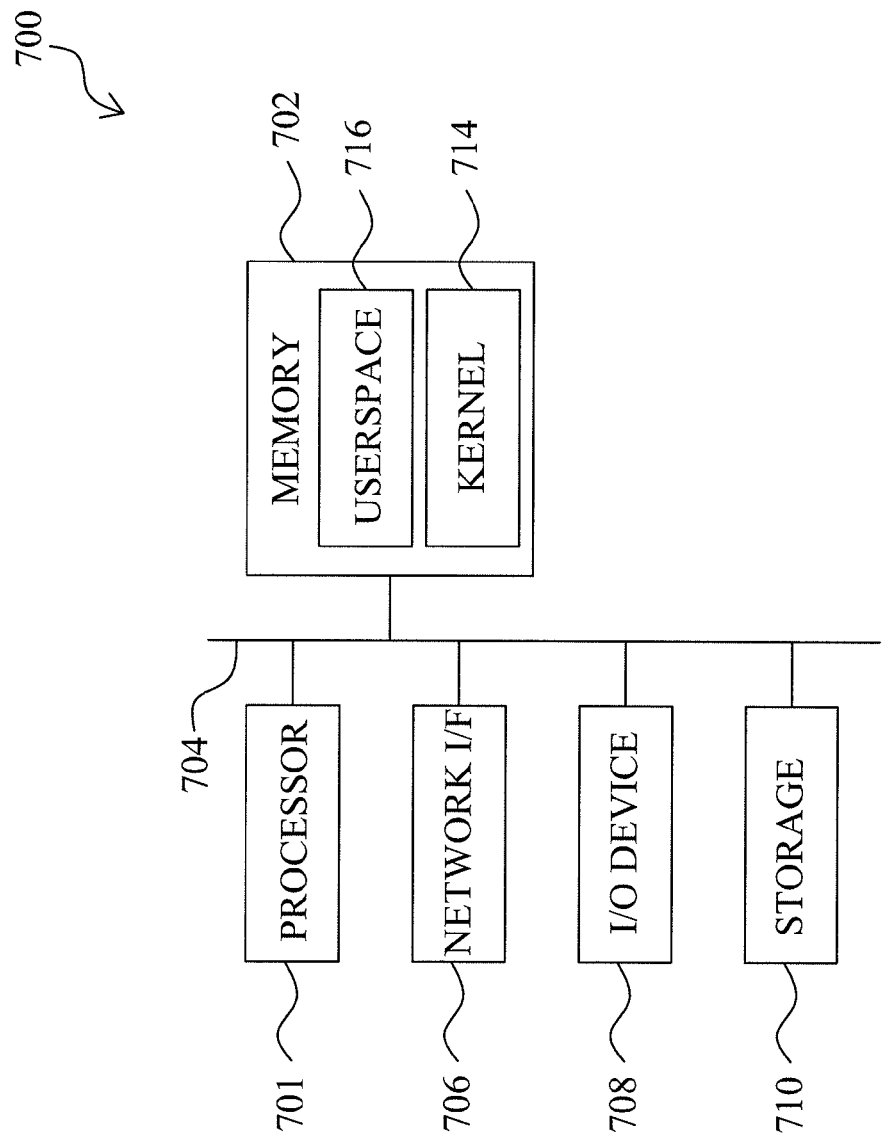
FIG. 7 is a block diagram of a computer system in accordance with some embodiments.

FIG. 7 is a block diagram of a computer system 700 in accordance with some embodiments. One or more of the tools and/or systems and/or operations described with respect to FIGS. 1-6 is realized in some embodiments by one or more computer systems 700 of FIG. 7. The system 700 comprises a processor 701, a memory 702, a network interface (I/F) 706, a storage 710, an input/output (I/O) device 708 communicatively coupled via a bus 704 or other interconnection communication mechanism.

The memory 702 comprises, in some embodiments, a random access memory (RAM) and/or other dynamic storage device and/or read only memory (ROM) and/or other static storage device, coupled to the bus 704 for storing data and/or instructions to be executed by the processor 701, e.g., kernel 714, userspace 716, portions of the kernel and/or the userspace, and components thereof. The memory 702 is also used, in some embodiments, for storing temporary variables or other intermediate information during execution of instructions to be executed by the processor 701.

In some embodiments, a storage device 710, such as a magnetic disk or optical disk, is coupled to the bus 704 for storing data and/or instructions, e.g., kernel 714, userspace 716, etc. The I/O device 708 comprises an input device, an output device and/or a combined input/output device for enabling user interaction with the system 700. An input device comprises, for example, a keyboard, keypad, mouse, trackball, trackpad, and/or cursor direction keys for communicating information and commands to the processor 701. An output device comprises, for example, a display, a printer, a voice synthesizer, etc. for communicating information to a user.

In some embodiments, one or more operations and/or functionality of the tools and/or systems described with respect to FIGS. 1-6 are realized by the processor 701, which is programmed for performing such operations and/or functionality. One or more of the memory 702, the OF 706, the storage 710, the I/O device 708, the hardware components 718, and the bus 704 is/are operable to receive instructions, data, design rules, netlists, layouts, models and/or other parameters for processing by the processor 701.

In some embodiments, one or more of the operations and/or functionality of the tools and/or systems described with respect to FIGS. 1-6 is/are implemented by specifically configured hardware (e.g., by one or more application specific integrated circuits (ASICs) which is/are included) separate from or in lieu of the processor 701. Some embodiments incorporate more than one of the described operations and/or functionality in a single ASIC.

In some embodiments, the operations and/or functionality are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

The above methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

An aspect of this description relates to a method of generating a netlist. The method comprises A method of generating a netlist comprises detecting electrical components included in a layout of a semiconductor device. The method further comprises establishing a defined region having a boundary surrounding a first set of electrical components based on a type of at least one electrical component included in the first set of electrical components. The method further comprises extracting a first capacitance value between the electrical components of the first set of electrical components positioned inside the defined region, the first capacitance value being extracted using a first extraction technique. The method additionally comprises extracting a second capacitance value between the electrical components of a second set of electrical components, the second set of electrical components comprising at least one electrical component positioned outside the defined region, the second capacitance value being extracted using a second extraction technique different from the first extraction technique. The method also comprises generating the netlist, the netlist including the first capacitance value and the second capacitance value. The first extraction technique is capable of extracting one or more capacitance values between electrical components arranged in a first quantity of directions with respect to one another and the second extraction technique is capable of extracting one or more capacitance values between electrical components arranged in a second quantity of directions with respect to one another. The first quantity of directions is greater than the second quantity of directions.

Another aspect of this description relates to a method of generating a netlist. The method comprises generating a boundary of a defined region surrounding a first set of electrical component of a plurality of electrical components included in a layout of a semiconductor device, the boundary of the defined region being based on a user input. The method also comprises extracting a first capacitance value between the electrical components of the first set of electrical components positioned inside the defined region, the first capacitance value being extracted using a first extraction method. The method further comprises extracting a second capacitance value between the electrical components of a second set of electrical components, the second set of electrical components comprising at least one electrical component positioned outside the defined region, the second capacitance value being extracted using a second extraction method different from the first extraction method. The method additionally comprises generating the netlist, the netlist including the first capacitance value and the second capacitance value. The first extraction method is capable of extracting one or more capacitance values between electrical components arranged in a first quantity of directions with respect to one another and the second extraction method is capable of extracting one or more capacitance values between electrical components arranged in a second quantity of directions with respect to one another. The first quantity of directions is greater than the second quantity of directions.

A further aspect of this description relates to a method of generating a netlist. The method comprises detecting one or more types of electrical components included in a layout of a semiconductor device. The method also comprises establishing a first defined region having a first boundary surrounding a first set of electrical components based on a first type of at least one electrical component included in the first set of electrical components. The method further comprises establishing a second defined region having a second boundary surrounding a second set of electrical components based on a second type of at least one electrical component included in the second set of electrical components. The method further comprises establishing a third defined region having a third boundary surrounding a third set of electrical components based on a location of at least one electrical component included in the third set of electrical components. The method additionally comprises extracting a first capacitance value between the electrical components of the first set of electrical components positioned inside the first defined region, the first capacitance value being extracted using a first extraction technique. The method also comprises extracting a second capacitance value between the electrical components of the second set of electrical components inside the second defined region, the second capacitance value being extracted using a second extraction technique different from the first extraction technique. The method further comprises extracting a third capacitance value between the electrical components of the third set of electrical components inside the third defined region, the third capacitance value being extracted using a third extraction technique different from the first extraction technique and different from the second extraction technique. The method also comprises generating the netlist, the netlist including the first capacitance value and the second capacitance value. The first extraction technique is capable of extracting one or more capacitance values between electrical components arranged in a first quantity of directions with respect to one another and the second extraction technique is capable of extracting one or more capacitance values between electrical components arranged in a second quantity of directions with respect to one another. The first quantity of directions is greater than the second quantity of directions.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of generating a netlist, the method comprising:
    detecting one or more types of electrical components included in a layout of a semiconductor device;
    establishing a defined region having a boundary surrounding a first set of electrical components based on a type of at least one electrical component included in the first set of electrical components;
    extracting a first capacitance value, using a first extraction tool, between the electrical components of the first set of electrical components positioned inside the defined region, the first capacitance value being extracted using a first extraction technique;
    extracting a second capacitance value, using a second extraction tool, between the electrical components of a second set of electrical components, the second set of electrical components comprising at least one electrical component positioned outside the defined region, the second capacitance value being extracted using a second extraction technique different from the first extraction technique; and
    generating the netlist, the netlist including the first capacitance value and the second capacitance value,
    wherein the first extraction technique is capable of extracting one or more capacitance values between electrical components arranged in a first quantity of directions with respect to one another and the second extraction technique is capable of extracting one or more capacitance values between electrical components arranged in a second quantity of directions with respect to one another, the first quantity of directions being greater than the second quantity of directions.

2. The method of claim 1, wherein extracting the first capacitance value comprises extracting the first capacitance value multiple times using different extraction techniques.

3. The method of claim 1, further comprising:
    extracting a third capacitance value between one electrical component inside the defined region and one electrical component outside the defined region using a third extraction technique,
    wherein the third extraction technique is capable of extracting one or more capacitance values between electrical components arranged in a third quantity of directions with respect to one another, the third quantity of directions being greater than the second quantity of directions.

4. The method of claim 1, wherein the second capacitance value is extracted before the first capacitance value is extracted.

5. The method of claim 1, further comprising:
    extracting a third capacitance value between at least one electrical component of the first set of electrical components and at least one electrical component of the second set of electrical components; and
    incorporating the extracted third capacitance value into the netlist.

6. The method of claim 5, wherein the third capacitance value is extracted using a third extraction technique different from the first extraction technique and different from the second extraction technique.

7. The method of claim 5, wherein at least one of the first capacitance value, the second capacitance value, or the third capacitance value is extracted between electrical components positioned in two different layers of the layout.

8. The method of claim 1, wherein the first extraction method and the second extraction method are performed simultaneously.

9. The method of claim 1, wherein the first extraction technique is a 3-dimensional (3D) technique.

10. The method of claim 9, wherein the second extraction technique is a 1-dimensional (1D) technique, a 2-dimensional (2D) technique, or a 2.5-dimensional (2.5D) technique.

11. A method of generating a netlist, the method comprising:
    generating a boundary of a defined region surrounding a first set of electrical components of a plurality of electrical components included in a layout of a semiconductor device, the boundary of the defined region being based on a user input;
    extracting a first capacitance value, using a first extraction tool, between the electrical components of the first set of electrical components positioned inside the defined region, the first capacitance value being extracted using a first extraction method;
    extracting a second capacitance value, using a second extraction tool, between the electrical components of a second set of electrical components, the second set of electrical components comprising at least one electrical component positioned outside the defined region, the second capacitance value being extracted using a second extraction method different from the first extraction method; and
    generating the netlist, the netlist including the first capacitance value and the second capacitance value,
    wherein the first extraction method is capable of extracting one or more capacitance values between electrical components arranged in a first quantity of directions with respect to one another and the second extraction method is capable of extracting one or more capacitance values between electrical components arranged in a second quantity of directions with respect to one another, the first quantity of directions being greater than the second quantity of directions.

12. The method of claim 11, wherein extracting the first capacitance value comprises extracting the first capacitance value multiple times using different extraction techniques.

13. The method of claim 11, further comprising:
extracting a third capacitance value between one electrical component inside the defined region and one electrical component outside the defined region using a third extraction method,
wherein the third extraction method is capable of extracting one or more capacitance values between electrical components arranged in a third quantity of directions with respect to one another, the third quantity of directions being greater than the second quantity of directions.

14. The method of claim 11, wherein the first extraction method and the second extraction method are performed simultaneously.

15. The method of claim 11, further comprising:
extracting a third capacitance value between at least one electrical component of the first set of electrical components and at least one electrical component of the second set of electrical components; and
incorporating the extracted third capacitance value into the netlist,
wherein the third capacitance value is extracted using a third extraction method different from the first extraction method and different from the second extraction method.

16. The method of claim 15, wherein the layout of the semiconductor device comprises multiple layers, and at least one of the first capacitance value, the second capacitance value, or the third capacitance value is extracted between electrical components positioned in two different layers of the layout.

17. The method of claim 11, wherein the first extraction method is a 3-dimensional (3D) method.

18. The method of claim 17, wherein the second extraction method is a 1-dimensional (1D) method, a 2-dimensional (2D) method, or a 2.5-dimensional (2.5D) method, and extracting the first capacitance value consumes greater computing resources than extracting the second capacitance value.

19. A method of generating a netlist, the method comprising:
detecting one or more types of electrical components included in a layout of a semiconductor device;
establishing a first defined region having a first boundary surrounding a first set of electrical components based on a first type of at least one electrical component included in the first set of electrical components;
establishing a second defined region having a second boundary surrounding a second set of electrical components based on a second type of at least one electrical component included in the second set of electrical components;
establishing a third defined region having a third boundary surrounding a third set of electrical components based on a location of at least one electrical component included in the third set of electrical components;
extracting a first capacitance value, using a first extraction tool, between the electrical components of the first set of electrical components positioned inside the first defined region, the first capacitance value being extracted using a first extraction technique;
extracting a second capacitance value, using a second extraction tool, between the electrical components of a second set of electrical components inside the second defined region, the second capacitance value being extracted using a second extraction technique different from the first extraction technique;
extracting a third capacitance value between the third set of electrical components inside the third defined region, the third capacitance value being extracted using a third extraction technique different from the first extraction technique and different from the second extraction technique; and
generating the netlist, the netlist including the first capacitance value and the second capacitance value,
wherein the first extraction technique is capable of extracting one or more capacitance values between electrical components arranged in a first quantity of directions with respect to one another and the second extraction technique is capable of extracting one or more capacitance values between electrical components arranged in a second quantity of directions with respect to one another, the first quantity of directions being greater than the second quantity of directions.

20. The method of claim 19, further comprising:
extracting location information associated with the electrical components of the first set of electrical components, the electrical components of the second set of electrical components, and the electrical components of the third set of electrical components,
wherein the first boundary and the second boundary are further based on the extracted location information of the first set of electrical components, the location information of the second set of electrical components, the location information of the third set of electrical components, and one or more pre-defined rules corresponding to establishing the first boundary, the second boundary and the third boundary.

* * * * *